United States Patent
Ishikawa et al.

(10) Patent No.: US 12,065,727 B2
(45) Date of Patent: *Aug. 20, 2024

(54) MEMBER FOR PLASMA PROCESSING DEVICE AND PLASMA PROCESSING DEVICE PROVIDED WITH SAME

(71) Applicant: KYOCERA Corporation, Kyoto (JP)

(72) Inventors: Kazuhiro Ishikawa, Shiga (JP); Takashi Hino, Yokohama (JP); Shuichi Saito, Yokohama (JP)

(73) Assignee: Kyocera Corporation, Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/299,221

(22) PCT Filed: Dec. 2, 2019

(86) PCT No.: PCT/JP2019/046997
§ 371 (c)(1),
(2) Date: Jun. 2, 2021

(87) PCT Pub. No.: WO2020/116384
PCT Pub. Date: Jun. 11, 2020

(65) Prior Publication Data
US 2022/0042161 A1  Feb. 10, 2022

(30) Foreign Application Priority Data
Dec. 5, 2018  (JP) .................. 2018-228361

(51) Int. Cl.
*C23C 14/08* (2006.01)
*C04B 35/10* (2006.01)
(Continued)

(52) U.S. Cl.
CPC ............ *C23C 14/083* (2013.01); *C04B 35/10* (2013.01); *C04B 35/505* (2013.01);
(Continued)

(58) Field of Classification Search
None
See application file for complete search history.

(56) References Cited

U.S. PATENT DOCUMENTS

2005/0037193 A1* 2/2005 Sun .................. C30B 35/00
427/446
2005/0042483 A1 2/2005 Billieres et al.
(Continued)

FOREIGN PATENT DOCUMENTS

CN  102245540 A  11/2011
EP  1676935 A2  7/2006
(Continued)

OTHER PUBLICATIONS

Bib data and translation of JP-2013095644-A; Fujita et al; May 2013 (Year: 2013).*
Bib Data WO2019026818A1—Jul. 30, 2018; Hino (Year: 2019).*

*Primary Examiner* — Seth Dumbris
*Assistant Examiner* — Elizabeth D Ivey
(74) *Attorney, Agent, or Firm* — Procopio, Cory, Hargreaves & Savitch LLP

(57) ABSTRACT

Provided are a member for plasma processing device which has an excellent plasma resistance and improved adhesion strength of a film to a base material, and a plasma processing device provided with the same. A member for plasma processing device includes: a base material containing a first element which is a metal element or a metalloid element; a film containing a rare-earth element oxide, or a rare-earth element fluoride, or a rare-earth element oxyfluoride as a major constituent, the film being located on the base material; and an amorphous portion containing the first element, a rare earth element, and at least one of oxygen and fluorine, the amorphous portion being interposed between the base material and the film.

5 Claims, 3 Drawing Sheets

(51) Int. Cl.
*C04B 35/505* (2006.01)
*H01J 37/32* (2006.01)

(52) U.S. Cl.
CPC ...... *C23C 14/081* (2013.01); *H01J 37/32467* (2013.01); *H01J 37/32477* (2013.01); *H01J 2237/3328* (2013.01)

(56) References Cited

U.S. PATENT DOCUMENTS

| | | | | |
|---|---|---|---|---|
| 2009/0233126 | A1* | 9/2009 | Iwasawa | C23C 24/04 |
| | | | | 428/702 |
| 2013/0277332 | A1 | 10/2013 | Aheem et al. | |
| 2018/0087144 | A1* | 3/2018 | Sun | C23C 14/34 |
| 2018/0209042 | A1 | 7/2018 | Wu et al. | |
| 2018/0240648 | A1* | 8/2018 | Wu | C23C 16/50 |
| 2019/0382888 | A1* | 12/2019 | Wu | C23C 16/40 |
| 2020/0165715 | A1* | 5/2020 | Hino | C23C 14/5853 |

FOREIGN PATENT DOCUMENTS

| | | | |
|---|---|---|---|
| JP | 4532489 B | | 6/2010 |
| JP | 2013-95644 A | | 5/2013 |
| JP | 2013095644 A | * | 5/2013 |
| JP | 2018-188735 A | | 11/2018 |
| KR | 10-2005-0008855 A | | 1/2005 |
| KR | 10-2010-0131306 A | | 12/2010 |
| KR | 10-2018-0086161 A | | 7/2018 |
| TW | 200631114 A | | 9/2006 |
| WO | 2004/003962 A2 | | 1/2004 |
| WO | 2010/056338 A2 | | 5/2010 |
| WO | 2019/026818 A1 | | 2/2019 |
| WO | WO-2019026818 A1 * | 2/2019 | ........... C23C 14/083 |
| WO | 2019/194248 A1 | | 10/2019 |

\* cited by examiner

MEMBER FOR PLASMA PROCESSING DEVICE AND PLASMA PROCESSING DEVICE PROVIDED WITH SAME

CROSS-REFERENCE TO RELATED APPLICATION

This application is a national stage entry according to 35 U.S.C. 371 of International Application No. PCT/JP2019/046997 filed on Dec. 2, 2019, which claims priority to Japanese Patent Application No. 2018-228361 filed on Dec. 5, 2018, the contents of which are entirely incorporated herein by reference.

BACKGROUND ART

In a related art, as members for plasma processing device in need of high plasma resistance, there is used a member for plasma processing device, including: a base material; and a film formed as a sprayed coating from yttrium oxide by spraying process.

For example, Japanese Examined Patent Publication JP-B2 4532489 (Patent Literature 1) proposes such a member for plasma processing device in the form of a ceramic article including: a base material made of alumina; and a corrosion-proof coating applied directly to the base material with an adhesion strength of about 15 MPa or greater.

Unfortunately, as described in Japanese Examined Patent Publication JP-B2 4532489 (Patent Literature 1), the maximum adhesion strength of the corrosion-proof coating is limited to be only 46 MPa. Considering the growing demand for even higher coating adherability to a base material in these days, the described corrosion-proof coating will probably fail to measure up to expectations.

Furthermore, where the ceramic article is used under repeated cycles of rise and fall in temperature, in the corrosion-proof coating formed by spraying process, substantial amounts of pores and microcracks presumably persist, which may lead to unsuccessful reduction in particles.

These circumstances have created a demand for a member for plasma processing device which has an excellent plasma resistance and improved adhesion strength of a film to a base material, and a plasma processing device provided with the same.

SUMMARY

A member for plasma processing device according to the disclosure includes: a base material containing a first element which is a metal element or a metalloid element; a film containing a rare-earth element oxide, or a rare-earth element fluoride, or a rare-earth element oxyfluoride as a major constituent, the film being located on the base material; and an amorphous portion containing the first element, yttrium, and at least one of oxygen and fluorine, the amorphous portion being interposed between the base material and the film.

Moreover, a member for plasma processing device according to the disclosure includes: a base material containing a first element which is a metal element or a metalloid element; a film containing a rare-earth element oxide, or a rare-earth element fluoride, or a rare-earth element oxyfluoride as a major constituent, the film being located on the base material; and an intermediate layer containing silicon oxide and other metal oxide than the silicon oxide, the intermediate layer being interposed between the base material and the film.

Moreover, a method of manufacturing a member for plasma processing device according to the disclosure includes the steps of: obtaining a hardened layer by applying a paste, which contains silicon oxide as a major constituent and also contains other metal oxide than the silicon oxide, to the base material, and thereafter heat-treating the paste; making the hardened layer into an intermediate layer by subjecting a surface of the hardened layer to smoothing process; and forming, by sputtering, a film containing a rare-earth element oxide, or a rare-earth element fluoride, or a rare-earth element oxyfluoride as a major constituent on a film-facing surface of the intermediate layer obtained through the smoothing process.

A plasma processing device according to the disclosure includes the member for plasma processing device described above.

BRIEF DESCRIPTION OF DRAWINGS

Other and further objects, features, and advantages of the invention will be more explicit from the following detailed description taken with reference to the drawings wherein.

DETAILED DESCRIPTION

A member for plasma processing device according to the disclosure will now be described in detail with reference to drawings.

Figure 1:
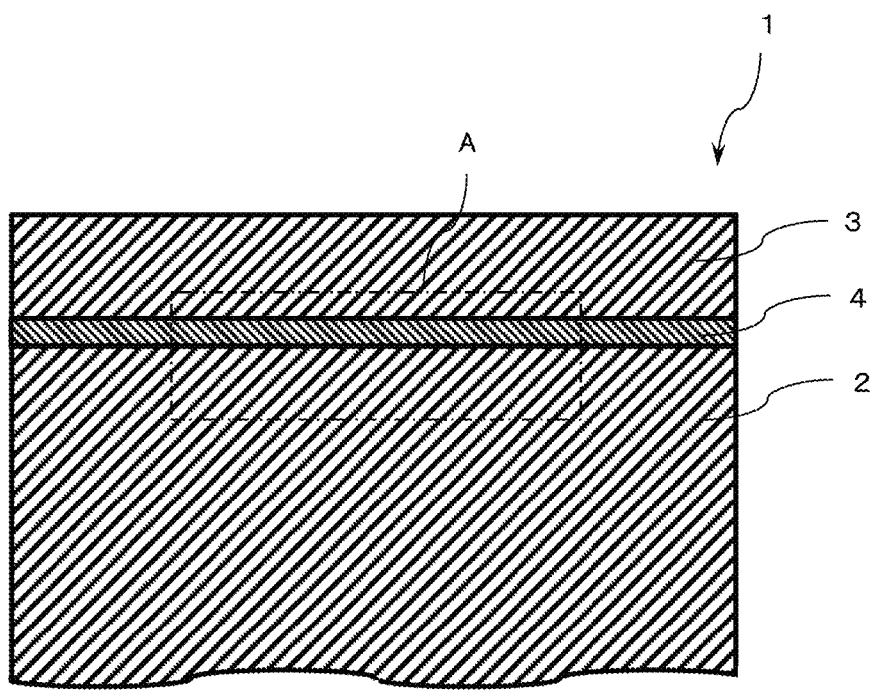
FIG. 1 is a schematic view showing an example of a section of a member for plasma processing device according to the disclosure.

As shown in FIG. 1, a member for plasma processing device 1 according to the disclosure includes: a base material 2 containing a first element which is a metal element or a metalloid element; a film 3 containing a rare-earth element oxide as a major constituent, the film 3 being located on the base material 2; and an amorphous portion 4 containing the first element, a rare earth element, and oxygen, the amorphous portion 4 being interposed between the base material 2 and the film 3. The amorphous portion 4, when containing the first element and a rare earth element, exhibits high covalent bindability with respect to the base material 2 and the film 3, and therefore the strength of adhesion of the film 3 to the base material 2 can be increased. Moreover, by virtue of its amorphous nature, the amorphous portion 4 undergoes smooth progress of structural relaxation even under repeated cycles of rise and fall in temperature, and therefore a sufficient adhesion strength can be retained. For example, in the case where the film 3 has a thickness of 10 μm or more and 200 μm or less, and the amorphous portion 4 has a thickness of 2 nm or more and 4 nm or less, then an adhesion strength of 60 MPa or greater can be attained. For measurement of adhesion strength, after setting a stud pin for peeling off the film 3 securely on the surface of the film 3 by using epoxy resin, the film 3 is subjected to adhesion strength testing using a thin-film adhesion tester (Sebastian V-A Adhesion Tester manufactured by Quad Group Inc.).

The metalloid element refers to an element that possesses properties that are intermediate between those of metal element and nonmetal element, and more specifically six elements, namely boron, silicon, germanium, arsenic, antimony, and tellurium.

Examples of the rare earth element include yttrium, ytterbium, holmium, erbium, and dysprosium.

Examples of the base material 2 include quartz, aluminum which is 99.999% (5N) or greater pure, an aluminum alloy such as a 6061 aluminum alloy, aluminum nitride ceramics, aluminum oxide ceramics, and silicon carbide ceramics. For example, aluminum oxide ceramics refers to ceramics containing an aluminum oxide content, i.e. the content of Al in $Al_2O_3$ equivalent, of greater than or equal to 90% by mass based on 100% by mass set as the total mass of the components constituting the base material 2.

The aluminum oxide content may be greater than or equal to 94% by mass, or preferably greater than or equal to 99.999% by mass, in particular.

Aluminum oxide ceramics may occasionally contain, in addition to aluminum oxide, magnesium oxide, calcium oxide, silicon oxide, etc. Silicon carbide ceramics may occasionally contain, in addition to silicon carbide, boron, carbon, etc.

Aluminum which is 99.999% (5N) or greater pure, an aluminum alloy such as a 6061 aluminum alloy, and aluminum nitride ceramics each contain iron, copper, and silicon as inevitable impurities.

Moreover, in the disclosure, the major constituent of the film 3 refers to a component constituting 90% by mass or greater of the film 3 based on 100% by mass set as the total mass of the components constituting the film 3. That is, a film containing a rare-earth element oxide, or a rare-earth element fluoride, or a rare-earth element oxyfluoride as a major constituent may correspond to a film containing one or two or more of the rare-earth element oxide, the rare-earth element fluoride, and the rare-earth element oxyfluoride in a total amount of 90% by mass or greater.

The component constituting the base material 2, as well as the component constituting the film 3, may be identified on the basis of the result of measurement by X-ray diffractometer using CuKα radiation. For example, the content of each constituent component may be determined by ICP (Inductively Coupled Plasma) optical emission spectrometer or X-ray fluorescence analyzer.

FIG. 1 is a view intended for clear understanding of how the film 3 and the amorphous portion 4 are to be provided, and the correlation in thickness among the base material 2, the film 3, and the amorphous portion 4 is therefore not represented faithfully in FIG. 1.

For example, the rare-earth element oxide is expressed in compositional-formula form as: $RE_2O_{3-x}$ (wherein x is greater than or equal to 0 and less than or equal to 1), the rare-earth element fluoride is expressed in compositional-formula form as: $REF_{3-x}$ (wherein x is greater than or equal to 0 and less than or equal to 1), and the rare-earth element oxyfluoride is expressed in compositional-formula form as: REOF. In the case where the rare earth element refers to yttrium, for example, yttrium oxide is expressed in compositional-formula form as: $Y_2O_{3-x}$ (wherein x is greater than or equal to 0 and less than or equal to 1).

The film 3 is not limited to those containing the major constituent only. Depending on the purity of a target used in the formation of the film 3, the apparatus design, etc., the film 3 may contain other elements than the major constituent, such as sodium (Na), magnesium (Mg), aluminum (Al), silicon (Si), phosphorus (P), sulfur (S), chlorine (Cl), potassium (K), calcium (Ca), titanium (Ti), chromium (Cr), manganese (Mn), iron (Fe), cobalt (Co), nickel (Ni), copper (Cu), zinc (Zn), and strontium (Sr). X-ray diffractometer for thin films may be used for identification of the components constituting the film 3.

In order to identify the amorphous portion 4 as an amorphous substance, a sample is formed first by subjecting the member for plasma processing device 1 according to the disclosure to focused ion beam (FIB) processing. With use of part of the resulting sample as the object of observation under an atomic resolution analytical electron microscope (for example, JEM-ARM200F or a succeeding upgraded version manufactured by JEOL Ltd.), amorphous identification is made on the basis of an electron diffraction pattern obtained at an accelerating voltage of 200 kv through the fast Fourier transformation (FFT).

A measurement area for observation by the atomic resolution analytical electron microscope may have dimensions of 15 nm by 15 nm. Moreover, in order for a diffraction pattern exhibiting amorphous characteristics to be detected within the measurement area measuring 15 nm by 15 nm, a measurement area for electron diffraction pattern detection may have dimensions of 2 nm by 2 nm.

Figure 2A:
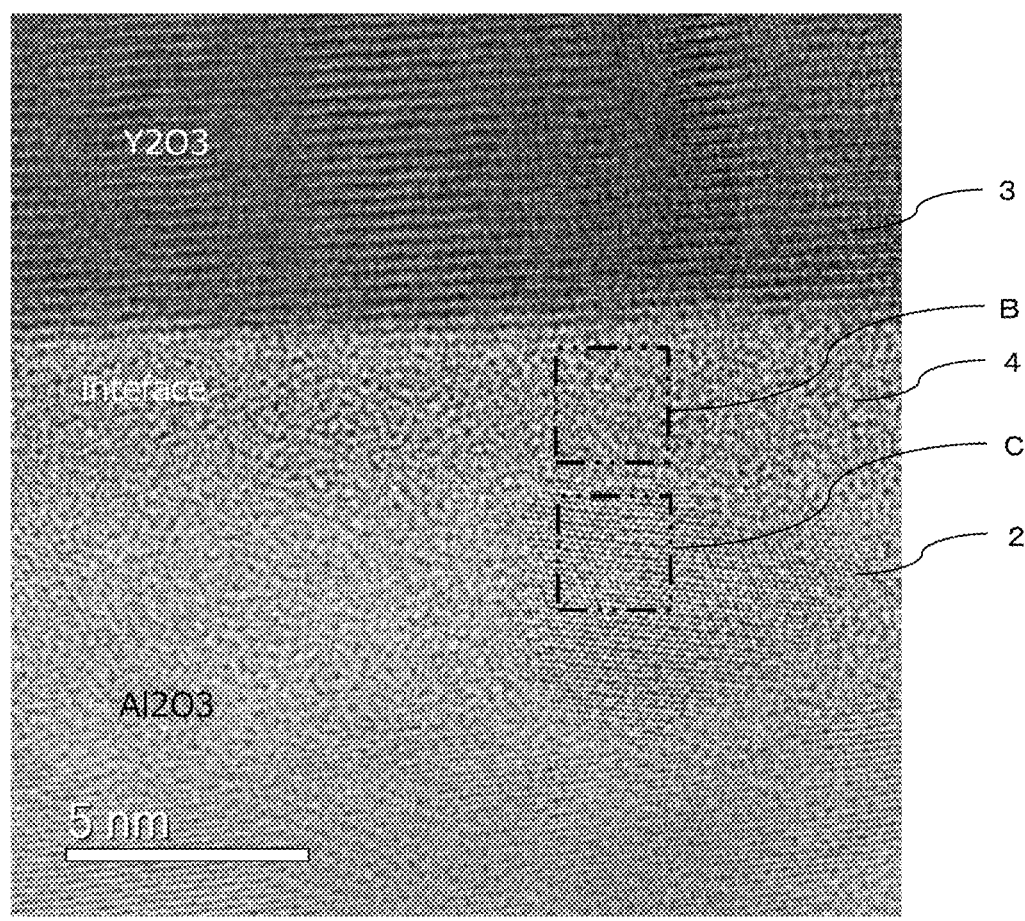
FIG. 2A is a microscopic image of part of a sample obtained as an observation object by focused ion beam (FIB) processing.
Figure 2B:
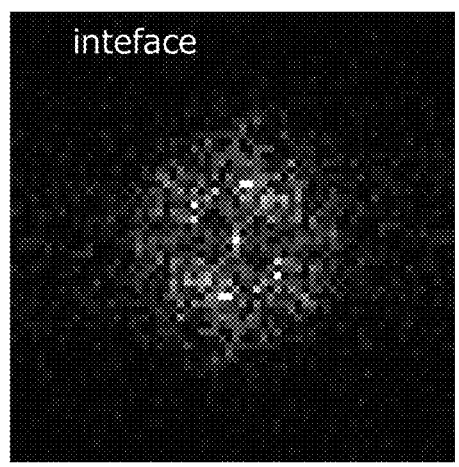
FIG. 2B is a plate showing an electron diffraction pattern of an area B in the amorphous portion shown in FIG. 2A obtained through the fast Fourier transformation (FFT)
Figure 2C:
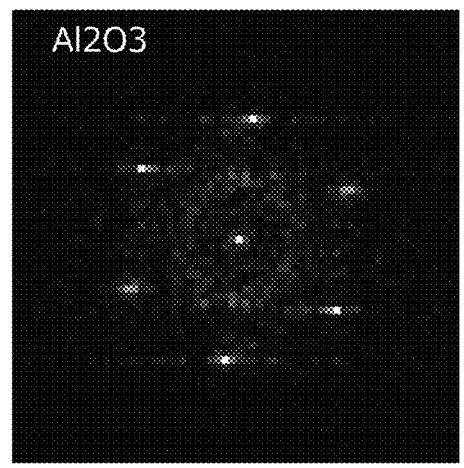
FIG. 2C is a plate showing an electron diffraction pattern of an area C in the base material shown in FIG. 2A obtained through the fast Fourier transformation (FFT)

FIG. 2A is a microscopic image of part of the sample obtained as an observation object by focused ion beam (FIB) processing. FIG. 2B is a plate showing an electron diffraction pattern of an area B in the amorphous portion shown in FIG. 2A obtained through the fast Fourier transformation (FFT). FIG. 2C is a plate showing an electron diffraction pattern of an area C in the base material shown in FIG. 2A obtained through the fast Fourier transformation (FFT).

A halo is seen in the electron diffraction pattern shown in FIG. 2B, which indicates an amorphous nature. On the other hand, concentric diffraction rings called Debye-Scherrer rings are seen in the electron diffraction pattern shown FIG. 2C, which indicates a crystalline nature.

Moreover, the amorphous portion 4 may contain yttrium in a predominant amount on a mass-ratio basis.

Thus constituted, the amorphous portion 4 is stable even when exposed to high-temperature environment, and is therefore less likely to react with electrically conductive silicon contained in the base material 2. This reduces the risk of leakage current.

The amorphous portion 4 preferably has a yttrium content of 42% by mass or greater based on 100% by mass set as the total mass of the components constituting the amorphous portion. In determining the mass ratios of the components constituting the amorphous portion 4, the amorphous portion 4 is subjected to the energy dispersive X-ray analysis (EDX) to derive atomic ratios of the elements constituting the amorphous portion 4, and the measured atomic ratios are each converted into a mass ratio.

The proportions of the elements constituting the amorphous portion 4 shown in FIG. 2B, namely yttrium, oxygen, and aluminum, are 45% by mass, 32.5% by mass, and 22.5% by mass, respectively.

Moreover, the amorphous portion 4 may be shaped in a layer, and a thickness of the amorphous portion 4 is greater than or equal to 0.0001 times and less than or equal to 0.0008 times the thickness of the film 3.

The amorphous portion 4, when given a thickness greater than or equal to 0.0001 times the thickness of the film 3, permits further increase in the strength of adhesion of the film 3 to the base material 2. The amorphous portion 4, when given a thickness less than or equal to 0.0008 times the thickness of the film 3, exhibits sufficiently low rigidity relative to the film 3. Thus, residual stress in the interior of the film 3 is less likely to propagate through the base material 2, making the base material 2 less prone to deformation.

The amorphous portion 4, when given a thickness greater than or equal to 0.0001 times and less than or equal to 0.0008 times the thickness of the film 3, permits further increase in the strength of adhesion of the film 3 to the base material 2, and also makes the base material 2 less prone to deformation.

Moreover, the amorphous portion 4 may be shaped in a layer having a thickness of 1 nm or more and 9 nm or less.

Thus constituted, the amorphous portion 4 permits, in a condition where the film 3 has a thickness on the order of dozens of nanometers, and more specifically a thickness of 10 nm or more and 100 μm or less, the strength of adhesion of the film 3 to the base material 2 can be further increased regardless of film thickness, and the base material 2 is less prone to deformation.

The thickness of the film 3, as well as the thickness of the amorphous portion 4, is determined by calculation using a microscopic image as shown in FIG. 2A.

Although the amorphous portion 4 shown in FIGS. 1 and 2A is shaped in a layer, as an alternative to the layer form, the amorphous portion 4 may be provided in the form of a plurality of amorphous blocks or balls on the base material 2.

Moreover, the film 3 may have a relative density of greater than or equal to 98%, or preferably greater than or equal to 99%. The film 23, when having a relative density in the described range, becomes a dense film, which can suppress particle generation even when undergoing thickness reduction under exposure to plasma. In determining the relative density of the film 3, an actually measured film density is obtained first in accordance with X-ray Reflectometry (XRR) using X-ray diffractometer for thin films, and then the ratio of the resulting measured density to a theoretical density is derived.

The amorphous portion 4 may be obtained by reforming part of the surface of the film 3 or by reforming part of the surface of the base material 2. In another alternative, the amorphous portion 4 may be independently formed as a separate component at the interface between the base material 2 and the film 3.

Moreover, as shown in FIG. 1, the member for plasma processing device 1 according to the disclosure includes: a base material 2 containing a first element which is a metal or metalloid element; a film 3 containing a rare-earth element oxide, or a rare-earth element fluoride, or a rare-earth element oxyfluoride as a major constituent, the film 3 being located on the base material 2; and an intermediate layer 4 containing silicon oxide and other metal oxide than the silicon oxide, the intermediate layer 4 being interposed between the base material 2 and the film 3. The intermediate layer 4 may be provided in combination with the amorphous portion 4 either in laminate form or mixed-layer form.

For example, the intermediate layer 4 is formed of a glaze layer. The silicon oxide is expressed in compositional-formula form as: $SiO_2$. Examples of the metal oxide include aluminum oxide which is expressed in compositional-formula form as: $Al_2O_3$ and yttrium oxide which is expressed in compositional-formula form as: $Y_2O_{3-y}$ (wherein y is greater than or equal to 0 and less than or equal to 1).

In the case where aluminum oxide and yttrium oxide are contained as the metal oxide, for example, the aluminum oxide content falls in a range of 16.4% by mass to 32.6% by mass, the yttrium oxide content falls in a range of 21.8% by mass to 43.3% by mass, the balance is the silicon oxide.

The intermediate layer 4 which contains silicon oxide as a major constituent and also contains other metal oxide than the silicon oxide, when lying between the base material 2 and the film 3, exhibits high covalent bindability with respect to the base material 2 and the film 3, and therefore the strength of adhesion of the film 3 to the base material 2 can be increased. Moreover, the interposition of the intermediate layer 4 reduces the influence of pores present on an intermediate layer-facing surface of the base material 2 opposed to the intermediate layer 4, and thus permits formation of a film of relatively uniform density.

For example, the intermediate layer 4 has a thickness of 5 μm to 30 μm.

Moreover, the intermediate layer 4 may contain crystalline rare-earth element silicate located on a film-facing surface thereof opposed to the film 3.

Thus constituted, the intermediate layer 4 provides an anchoring effect derived from crystalline rare-earth element silicate contained in that part thereof opposed to the film 3, and therefore the strength of adhesion of the film 3 to the intermediate layer 4 can be increased.

Examples of the rare-earth element silicate include monosilicate which is expressed in compositional-formula form as: $RE_2SiO_5$ and disilicate which is expressed in compositional-formula form as: $RE_2Si_2O_7$.

It is particularly advisable that the crystalline rare-earth element silicate is present in contiguous relation to the film-facing surface, as well as a base material-facing surface opposed to the base material of the intermediate layer. In this case, due to the strength of high melting point and high heat resistance of the crystalline rare-earth element silicate, the intermediate layer 4 becomes resistant to damage even when used in high-temperature environment.

Moreover, the base material 2 may be made of aluminum oxide ceramics, and may contain crystalline aluminum silicate located on its intermediate layer 4-facing surface.

Thus constituted, the base material 2 provides an anchoring effect derived from crystalline aluminum silicate contained in that part thereof opposed to the intermediate layer 4, and therefore the strength of adhesion of the film 3 to the intermediate layer 4 can be increased.

Examples of aluminum silicate include monosilicate which is expressed in compositional-formula form as: $Al_2SiO_5$ and disilicate which is expressed in compositional-formula form as: $Al_2Si_2O_7$.

The component constituting the intermediate layer 4 may be identified on the basis of the result of measurement by X-ray diffractometer using CuKα radiation. For example, the content of each constituent component may be determined by ICP (Inductively Coupled Plasma) optical emission spectrometer or X-ray fluorescence analyzer.

The following describes a method of manufacturing a member for plasma processing device according to the disclosure.

A base material-production method for cases where the base material is made of aluminum oxide ceramics will be described first.

There are prepared aluminum oxide ($Al_2O_3$) A powder having an average particle size of 0.4 μm to 0.6 μm, and aluminum oxide B powder having an average particle size of about 1.2 μm to 1.8 μm. There are also prepared silicon oxide ($SiO_2$) powder as a Si source, and calcium carbonate ($CaCO_3$) powder as a Ca source. As the silicon oxide powder, fine powdery silicon oxide having an average particle size of 0.5 μm or less is prepared. Moreover, magnesium hydroxide powder is used to obtain Mg-containing alumina ceramics. Note that other powdery materials than the aluminum oxide A powder and the aluminum oxide B powder will hereafter be collectively called "first secondary component powder" in the following description.

A predetermined amount of each first secondary component powder is weighed out. Next, an aluminum oxide powder mixture is prepared from the aluminum oxide A powder and the aluminum oxide B powder in respective amounts weighed out so that a mixture of the A powder and the B powder 40:60 to 60:40 ratio by mass can be obtained, and that the resulting alumina ceramics can contain Al in $Al_2O_3$ equivalent in an amount of greater than or equal to 99.4% by mass based on 100% by mass set as the total mass of the components constituting the alumina ceramics. Moreover, for preparation of the first secondary component powder, preferably, after determination of the amount of Na in the aluminum oxide powder mixture, the Na amount is converted into $Na_2O$ amount, and, certain amounts of the first secondary component powder are weighed out so that the amount ratio between Na in $Na_2O$ equivalent and the sum of the components constituting the first secondary component powder (Si, Ca, etc. in this case) on an oxide basis stands at or below 1.1 in the resulting aluminum oxide ceramics.

Then, a slurry is prepared by mixing and stirring, in a stirrer, the aluminum oxide powder mixture and the first secondary component powder, with the following components added: 1 to 1.5 parts by mass of a binder such as PVA (polyvinyl alcohol); 100 parts by mass of a solvent; and 0.1 to 0.55 parts by mass of a dispersant based on 100 parts by mass set as the total mass of the aluminum oxide powder mixture and the first secondary component powder.

The slurry is then formed into granules by spray granulation, and the granules are shaped into a molded body of predetermined shape by a powder press molding apparatus or an isostatic pressing apparatus, for example. The molded body is subjected to cutting work on an as needed basis. There is thus obtained a molded product in substrate form.

After being fired in the following conditions: a firing temperature of higher than or equal to 1500° C. and lower than or equal to 1700° C.; and the duration of retention time of longer than or equal to 4 hours and shorter than or equal to 6 hours, the molded product is ground, at its surface where the film is to be formed, by using diamond abrasive grains having an average particle size of greater than or equal to 1 μm and less than or equal to 5 μm, and a tin-made surface grinder. There is thus obtained the base material.

Figure 3:
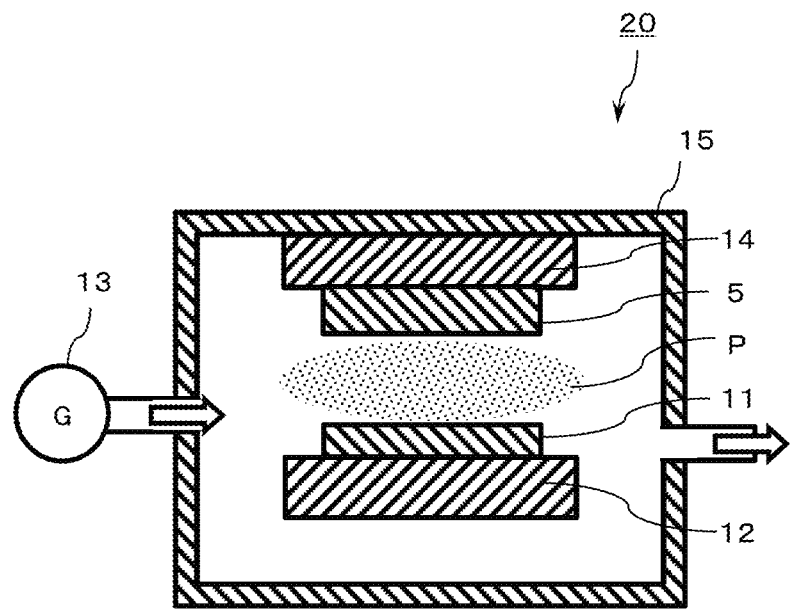
FIG. 3 is a schematic view showing a sputtering apparatus used to obtain the member for plasma processing device according to the disclosure.

Next, a method for forming the film will be described with reference to FIG. 3. FIG. 3 is a schematic view showing a sputtering apparatus 20 including: a chamber 15; a gas supply source 13 mounted in communication with the interior of the chamber 15; an anode 14 and a cathode 12 disposed inside the chamber 15; and a target 11 which is connected to the cathode 12 side.

A procedure for forming the film is as follows. The base material 5 obtained in the above-described manner is located on the anode 14 side inside the chamber 15. Moreover, the rare-earth element target 11 made of a metal which is 99.99% (4N) or greater pure is located on the opposite side, i.e. on the cathode 12 side, inside the chamber 15. In this state, the interior of the chamber 15 is brought under reduced pressure by a vacuum pump, and the gas supply source 13 supplies argon and oxygen as a gas G.

Then, a rare-earth element film is formed on the surface of the base material 5 by sputtering in the presence of plasma P generated through the application of an electric field between the anode 14 and the cathode 12 via a power supply. A film portion formed in one operation has thickness on the order of subnanometers. The resulting rare-earth element film is subjected to an oxidation process. The rare-earth element film-forming process and the oxidation process are conducted alternately to form a laminate having a total film thickness of greater than or equal to 10 μm and less than or equal to 200 μm. There is thus obtained the member for plasma processing device according to the disclosure including: the base material containing aluminum defined as the first element; the film containing rare-earth element oxide as a major constituent, the film being located on the base material; and the amorphous portion containing the first element and oxygen, the amorphous portion being interposed between the base material and the film.

In the case of obtaining a film containing rare-earth element fluoride as a major constituent, the gas supply source 13 supplies, as the gas G, argon and fluorine into the chamber 15 that has been brought under reduced pressure by the vacuum pump, and, the described oxidation process is replaced with a fluorination process.

In the case of obtaining a film containing rare-earth element oxyfluoride as a major constituent, the gas supply source 13 supplies, as the gas G, argon, oxygen, and fluorine into the chamber 15 that has been brought under reduced pressure by the vacuum pump, and, the described oxidation process is replaced with an oxy-fluorination process.

The production of a member for plasma processing device including an amorphous portion containing a rare earth element in a predominant amount on a mass-ratio basis may be accomplished with the shortening of the time taken for initial oxidation process, or fluorination process, or oxyfluorination process (hereafter referred to as "oxidation process, etc.") to, for example, 1 hour or shorter.

The production of a member for plasma processing device including an amorphous portion in a layer having a thickness greater than or equal to 0.0001 times and less than or equal to 0.0008 times the film thickness may be accomplished with the shortening of the time taken for initial oxidation process, etc. to 30 minutes or shorter.

The production of a member for plasma processing device including an amorphous portion in a layer having a thickness of 1 nm or more and 9 nm or less may be accomplished with the shortening of the time taken for initial oxidation process, etc. to 3 minutes or shorter.

The electric power which is provided via the power supply may be either one of high-frequency power and DC power.

The following describes a method of manufacturing a member for plasma processing device including an intermediate layer, which contains silicon oxide as a major constituent and also contains other metal oxide than silicon oxide, interposed between a base material and a film.

The following description deals with cases where aluminum oxide and yttrium oxide are contained as the metal oxide other than silicon oxide.

First, a paste, which contains silicon oxide powder, aluminum oxide powder, yttrium oxide powder, an organic solvent, and a binder such as an ethyl cellulose binder or acrylic binder, is applied to the polished surface of the base material obtained in the described production method by means of brush coating, spray coating, or otherwise.

On the basis of 100% by mass set as the total mass of the silicon oxide powder, the aluminum oxide powder, and the yttrium oxide powder, the aluminum oxide powder content falls in a range of 16.4% by mass to 32.6% by mass, and the yttrium oxide powder content falls in a range of 21.8% by mass to 43.3% by mass. The balance is the silicon oxide powder.

The paste applied to the polished surface of the base material is heat-treated, while being retained at a temperature of 1500° C. to 1700° C. for 2 hours to 4 hours, into a hardened layer.

The surface of the hardened layer is made into the film-facing surface of the intermediate layer through smoothing process. The smoothing process refers to grinding process such as lapping, polishing, or CMP (Chemical Mechanical Polishing), for example. For the case of adopting lapping as the grinding process, the surface is lapped with diamond abrasive grains having an average particle size of greater than or equal to 1 μm and less than or equal to 5 μm, and a tin-made surface grinder.

The production of a member for plasma processing device including an intermediate layer which contains crystalline a rare-earth element silicate on its film-facing surface may be accomplished with added heat treatment on the hardened layer obtained through heat treatment. In this case, for example, the hardened layer is further heat-treated, while being retained at a temperature of 1000° C. to 1450° C. for 8 hours to 10 hours.

Moreover, the production of a member for plasma processing device including an aluminum oxide ceramics-made base material containing crystalline aluminum silicate located on the intermediate layer-side surface thereof opposed to the intermediate layer may be accomplished with heat treatment which is performed after the formation of the hardened layer at a retention temperature of 1000° C. to 1450° C. and a retention time of 8 hours to 10 hours.

Then, a film containing a rare-earth element oxide, or a rare-earth element fluoride, or a rare-earth element oxyfluoride as a major constituent is formed on the film-facing surface of the intermediate layer by the described sputtering process. There is thus obtained the member for plasma processing device according to the disclosure.

The member for plasma processing device according to the disclosure obtained by the above-described manufacturing method achieves both reduced number of particles generated from within the open pores and reduced number of particles resulting from microcrack propagation, and is thus applicable to, for example, a radio-frequency transmissive window member that allows radio-frequency radiation for plasma generation to pass therethrough, a shower plate for distribution of gas for plasma production, and a susceptor for holding semiconductor wafers.

With the member for plasma processing device and the method of manufacturing the member according to the disclosure, there is provided a highly plasma-resistant member for plasma processing device including a film bonded to a base material with greater adhesion strength.

Moreover, with the plasma processing device according to the disclosure, there is provided a highly reliable plasma processing device.

The disclosure may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

REFERENCE SIGNS LIST

1: Member for plasma processing device
2: Base material
3: Film
4: Amorphous portion (Intermediate layer)
11: Target
12: Cathode
13: Gas supply source
14: Anode
15: Chamber
20: Sputtering apparatus

The invention claimed is:

1. A member for a plasma processing device, comprising:
a base material containing a first element which is a metal element or a metalloid element;
a film containing a rare-earth element oxide, or a rare-earth element fluoride, or a rare-earth element oxyfluoride as a major constituent, the film being located on the base material and a strength of adhesion of the film to the base material is 60 MPa or greater; and
an amorphous portion containing the first element, a rare earth element, and at least one of oxygen and fluorine, the amorphous portion being interposed between the base material and the film.

2. The member for a plasma processing device according to claim 1,
wherein the amorphous portion contains a rare earth element in a predominant amount on a mass-ratio basis.

3. The member for a plasma processing device according to claim 1,
wherein the amorphous portion is shaped in a layer, a thickness of the amorphous portion is greater than or equal to 0.0001 times and less than or equal to 0.0008 times a thickness of the film.

4. The member for a plasma processing device according to claim 1,
wherein the amorphous portion is shaped in a layer, and a thickness of the amorphous portion is 1 nm or more and 9 nm or less.

5. A plasma processing device, comprising:
the member for a plasma processing device according to claim 1.

* * * * *